(12) United States Patent
Behle et al.

(10) Patent No.: US 8,397,667 B2
(45) Date of Patent: Mar. 19, 2013

(54) PROCESS AND APPARATUS FOR THE PLASMA COATING OF WORKPIECES WITH SPECTRAL EVALUATION OF THE PROCESS PARAMETERS

(75) Inventors: Stephan Behle, Gau-Odernheim (DE); Andreas Lüettringhaus-Henkel, Darmstadt (DE); Peter Eimann, Schwabenheim (DE); Juergen Klein, Mainz (DE)

(73) Assignee: Schott AG, Mainz (DE)

( * ) Notice: Subject to any disclaimer, the term of this patent is extended or adjusted under 35 U.S.C. 154(b) by 1150 days.

(21) Appl. No.: 11/215,163

(22) Filed: Aug. 30, 2005

(65) Prior Publication Data
US 2006/0051520 A1 Mar. 9, 2006

(30) Foreign Application Priority Data
Aug. 31, 2004 (DE) .................... 10 2004 042 431

(51) Int. Cl.
C23C 16/00 (2006.01)
C23F 1/00 (2006.01)
H01L 21/306 (2006.01)
(52) U.S. Cl. ........... 118/723 R; 118/723 MW; 118/715; 156/345.24; 156/345.26
(58) Field of Classification Search ............ 118/723 R, 118/723 MW, 723 E, 723 I, 730; 156/345.24, 156/345.28, 345.55; 427/237, 238
See application file for complete search history.

(56) References Cited

U.S. PATENT DOCUMENTS

| | | | |
|---|---|---|---|
| 4,858,768 A * | 8/1989 | Plester .......................... 209/3.1 |
| 5,521,351 A * | 5/1996 | Mahoney ................. 219/121.59 |
| 5,690,745 A * | 11/1997 | Grunwald et al. .... 118/723 MW |
| 5,759,424 A * | 6/1998 | Imatake et al. ................. 216/60 |
| 5,789,754 A * | 8/1998 | Cathey et al. ................. 250/372 |
| 6,117,243 A * | 9/2000 | Walther ........................ 118/713 |
| 6,376,006 B1 * | 4/2002 | Gresko et al. ..................... 427/8 |
| 6,716,477 B1 * | 4/2004 | Komiyama et al. ............... 427/8 |
| 6,806,198 B1 * | 10/2004 | Ring et al. .................... 438/706 |
| 2004/0235299 A1 * | 11/2004 | Srivastava et al. ............ 438/689 |

FOREIGN PATENT DOCUMENTS

| | | |
|---|---|---|
| EP | 0821079 | 1/1998 |
| JP | 8106992 | 4/1996 |
| JP | 8181104 | 7/1996 |
| JP | 10060660 | 3/1998 |
| JP | 2000243268 | 9/2000 |
| JP | 2004061311 | 2/2004 |

OTHER PUBLICATIONS

Notification of Reason for Refusal dated Aug. 24, 2011 corresponding to Japanese Patent Application No. 2005-251479.

* cited by examiner

*Primary Examiner* — Rakesh Dhingra
(74) *Attorney, Agent, or Firm* — Ohlandt, Greeley, Ruggiero & Perle, LLP

(57) ABSTRACT

The invention provides a process for coating workpieces by plasma-induced chemical vapor deposition, in which a process gas is introduced into a coating chamber and a plasma is ignited by electromagnetic energy in at least one region of the coating chamber which adjoins the workpiece and in which the process gas is present, wherein the coating operation is monitored on the basis of at least one measured spectral parameter of the plasma, and the workpiece is removed in the event of a deviation from a desired range for the parameter.

13 Claims, 4 Drawing Sheets

210  213

211  214

210  213

220  215

225  215

US 8,397,667 B2

Figure 1:
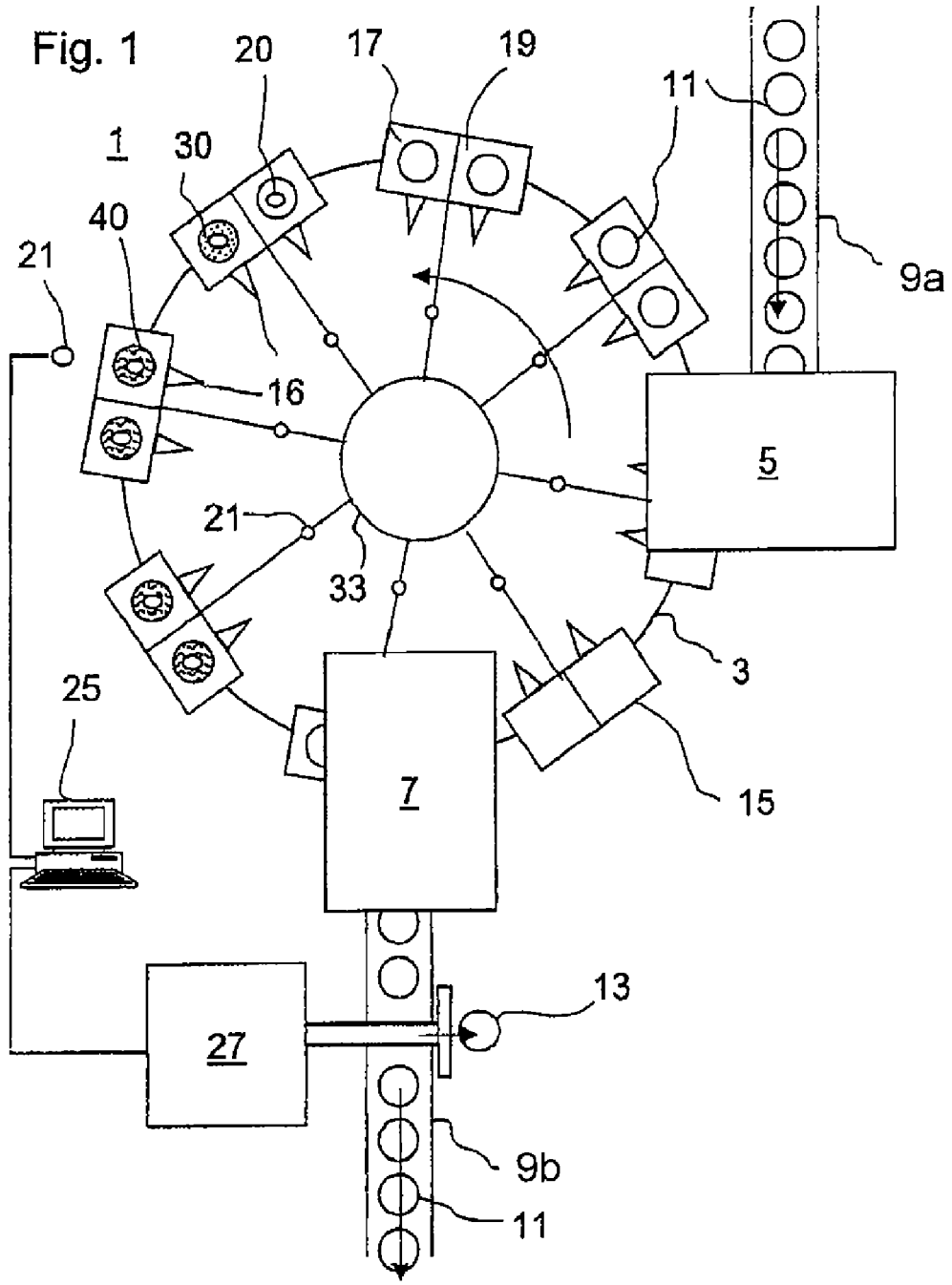

PROCESS AND APPARATUS FOR THE PLASMA COATING OF WORKPIECES WITH SPECTRAL EVALUATION OF THE PROCESS PARAMETERS

CROSS-REFERENCES TO RELATED APPLICATIONS

The present application is claiming priority of German Patent Application No. 10 2004 042431.4-45, filed on Aug. 31, 2004, the content of which is herein incorporated by reference.

BACKGROUND OF THE INVENTION

1. Field of the Invention

The invention relates in general terms to the plasma coating of containers, and in particular the invention relates to the spectroscopic monitoring of the coating process.

2. Description of Related Art

It is known to provide containers, such as in particular bottles, with barrier layers. These barrier layers are produced, inter alia, by chemical or physical vapor deposition. These processes can produce relatively thin layers with a high barrier action.

In particular plasma-enhanced or plasma-induced vapor deposition has proven a suitable chemical vapor deposition process; in this process, a plasma is ignited in a process gas by means of electromagnetic energy, and the reaction products which form in the plasma are deposited as a layer on the container.

This process is, inter alia, particularly suitable for the inexpensive coating of large quantities of workpieces, for example for coating plastic bottles in order to improve the barrier properties.

In this context, there is a demand for it to be possible to monitor the process sequence in a simple way and to detect incorrect coatings or workpieces quickly.

BRIEF SUMMARY OF THE INVENTION

Accordingly, the invention is based on the object of allowing fast and simple monitoring of the coating sequence and thereby of improving the quality of plasma-coated workpieces.

This object is achieved in a very surprisingly simple way by a process and a coating installation as provided in the present application. Advantageous configurations and refinements of the invention are also provided in the present application.

Accordingly, the invention provides a process for coating workpieces by means of plasma-induced chemical vapor deposition, in which a process gas is introduced into a coating chamber and a plasma is ignited by means of electromagnetic energy in at least one region of the coating chamber which adjoins the workpiece and in which the process gas is present, wherein the coating operation is monitored on the basis of at least one measured spectral parameter of the plasma, and the workpiece is removed in the event of a deviation from a desired range for the parameter.

In the context of the present invention, the term electromagnetic energy which is introduced into the coating chamber is to be understood in particular as meaning radiofrequency waves and/or microwaves. By way of example, microwaves with a frequency of 2.45 GHz are suitable.

A corresponding apparatus for coating workpieces by means of plasma-induced chemical vapor deposition, in particular using the process described above, to this end comprises a coating chamber, a device for introducing process gas and a device for introducing electromagnetic energy into the coating chamber, and the apparatus also includes a measuring device for measuring at least one spectral parameter of a plasma generated in the process gas by means of the electromagnetic energy, a monitoring device which is used to compare the parameter with a desired range, and a device for removing the workpiece if the parameter deviates from the desired range.

According to a preferred embodiment of the invention, the measurement of spectral parameters can be used to detect leaks. These leaks may occur, for example, at the coating chamber and may change the composition of the process gas and therefore also the coating which is deposited. If, according to a further preferred embodiment, the coating apparatus is designed for coating containers, in particular for internal coating, in which case for the internal coating process gas is introduced into the interior of the container and a plasma is then ignited therein, leaks at the containers themselves can also particularly preferably be detected by means of the invention. It is also possible to detect leaks in the feedline.

Spectroscopic measurement of the leak rate is extremely sensitive and fast, since it can take place during the coating process itself. It is then easy for defective containers to be removed by determining a deviation from the desired range without a prior or subsequent complicated leak test having to be carried out.

The intensity of an emission or absorption line of nitrogen is a particularly suitable spectral parameter for measuring the leak rate. Nitrogen is generally also present in the residual gas of an evacuated or partially evacuated coating chamber. If nitrogen from the surrounding environment enters the coating region with the process gas, the increased nitrogen content in the plasma means that the emission and absorption lines of nitrogen will form or be boosted, which can be determined spectroscopically in a very simple way and with a high sensitivity, since nitrogen contained in the process gas atmosphere, given a suitable concentration, can even be recognized by the naked eye on account of a discoloration of the plasma.

It is particularly easy to detect leaks if a process gas without nitrogen-containing components is used. In this case, it is sufficient for the—ideally completely absent—intensity of a nitrogen emission line, such as for example the N* line at 745 nm, to be compared with a threshold value. However, leak detection by measuring the intensity of an emission line of nitrogen can be carried out by an intensity measurement even in the case of a nitrogen-containing process gas, such as for example an HMDSN-containing mixture (HMDSN=hexamethyldisilazane).

A process gas with a silicon-containing component can be used to produce a barrier coating, with a silicon oxide layer being deposited. For many materials of the workpieces, such as for example plastic, it is additionally recommended to deposit a bonding layer and then to deposit the barrier layer on the bonding layer, by means of plasma-induced chemical vapor deposition, in order to increase the durability of the barrier coating.

In addition to the use of the measured spectral parameter for monitoring the coating process and/or the workpieces in order to allow defective workpieces to be removed, it is also possible for at least one further parameter of the coating process to be controlled using the at least one measured spectral parameter. In this context, consideration is given in particular to at least one of the parameters composition of the process gas, pressure of the process gas, power of the electromagnetic energy,
pulse duration of the electromagnetic energy,
duty cycle of the electromagnetic energy.

By way of example, the process gas pressure and/or the microwave power can be increased if the measured intensity of an emission line of the plasma is too weak.

A further particularly preferred embodiment of the invention also provides that pulsed electromagnetic energy is introduced into the coating chamber by means of a suitable device in order to generate a pulsed plasma. The pulsed plasma generation of this PICVD process, as it is known (PICVD=plasma impulse induced chemical vapor deposition), offers a number of significant advantages over continuous coating processes. For example, it is possible to feed in high powers, in which case increased temperature loads are avoided at the same time, on account of the interpulse periods. Moreover, the used process gas can be discharged during the interpulse periods, so that an increase in the levels of undesirable reaction products is avoided. This allows the production of particularly pure and well-defined coatings. At the same time, it is recommended also to utilize information from the measurement of the time profile of spectral parameters to monitor the process sequence and also to remove workpieces with a defective coating. For example, it is advantageously possible to measure the time profile of the emission of light of an emission line of a constituent of the process gas during a pulse in order to obtain information about the coating process. In this case too, deviations, determined by a monitoring device, from desired ranges which have an adverse effect on the product quality can be used to remove the associated workpieces.

Another example is the use of a process gas with a silicon-containing component, such as HMDSO or HMDSN, in which the time profile of an SiO emission line is measured.

As an alternative or in addition, it is also possible to measure the envelope of the intensity curve of the pulsed emission of an emission line as spectral parameter to enable conclusions to be drawn as to the coating quality or any defective workpieces.

The intensity of an emission line can also be used to count the pulses actually ignited. This is because plasma ignition and therefore deposition of material will not necessarily occur each time a pulse of electromagnetic energy is supplied. However, if the actual plasma pulses are counted on the basis of the emission of one or more emission lines, it is possible, inter alia, to work out the deposited layer thickness with a high degree of accuracy. Therefore, it is also recommended to use the count of the plasma pulses for process control. In particular, coating can in each case be continued until a predetermined number of pulses have been counted on the basis of the intensity of an emission line. The supply of electromagnetic pulses can then be stopped and either a further layer can be applied after the process gas has been changed or the next workpiece can be introduced.

The pulse number of an emission line can moreover also be used as a spectral parameter which, in the event of a deviation from a desired range, indicates a coating and/or workpiece defect, in order for these workpieces to be removed after or during the coating operation. For example, one possibility is to establish the number of actual plasma pulses per unit time. If, for example, a plasma is ignited insufficiently frequently, this may be an indicator of a defective coating. Defects of this type are conceivable, for example, if a container has been deformed during the coating of containers, so that an altered cavity results for the microwaves or radiofrequency waves. Deformations of this type can also be established, for example, on the basis of the pulse shape of an emission line when recording the time intensity profile. The pulse shape of an emission line is in particular also characteristic of the respective process gas composition, so that the pulse shape can also be used to draw conclusions as to the composition of the coating deposited and therefore to enable workpieces with a defective coating to be removed.

According to a variant, it is also possible for the number of plasma pulses to be compared with the number of electromagnetic pulses, which are likewise counted, on the basis of the intensity of an emission line or of a spectral region, in order to determine the number of incorrect ignitions or misfires and to recognize a defective coating if a threshold value, for example a ratio of incorrect ignitions to electromagnetic pulses, is exceeded, and to enable the associated workpiece to be removed. In other words, the workpiece is removed if the deviation between the number of plasma pulses and the number of electromagnetic pulses exceeds a threshold value.

The invention also provides for the intensity of an absorption line to be measured as an alternative or in addition to the intensity of an emission line. By way of example in the case of PICVD coating, this also allows measurements in the interpulse periods.

Moreover, it is advantageously possible to measure at least one spectral parameter of the absorption or emission spectrum of the process waste gas. This also allows conclusions as to the coating quality to be drawn, for example, on the basis of the reaction products formed.

The invention not only allows the production costs to be lowered by particularly simple and efficient process control, but also ensures that the products which can be produced in accordance with the invention are distinguished by a particularly high product quality.

For example, the removal in accordance with the invention of containers from among containers coated in a batch on the basis of the measurement of one or more spectral parameters allows the leak rate to be reduced by 90%, preferably by 95%, compared to an uncoated batch of containers.

Of course, it is also possible to reduce other defects in individual workpieces of a batch, such as for example defective coatings with a deviant layer composition.

The monitoring of the coating process on the basis of spectral parameters also allows a particularly low level of variation in the layer thickness of the deposited coating, amounting to at most 5% between the workpieces within the batch. In the context of the invention, this is not to be understood as meaning that the layer thickness over the coated surface of the workpiece varies only by this amount, but rather that the layer thickness at a comparable location, for example the middle of the base of the bottle, only deviates by this small amount from workpiece to workpiece.

If, for example, an excessive number of ignition misfires leads to a layer thickness which is too low, this can be recognized by the monitoring device by measuring the plasma pulses per unit time, and the workpiece in question can then be removed. This removal allows the variations in layer thickness within a batch accordingly to be reduced significantly.

In the text which follows, the invention is explained in more detail on the basis of exemplary embodiments and with reference to the drawings, in which identical and similar elements are provided with the same reference designations and the features of various exemplary embodiments can be combined with one another.

BRIEF DESCRIPTION OF THE SEVERAL
VIEWS OF THE DRAWINGS

Figure 2:
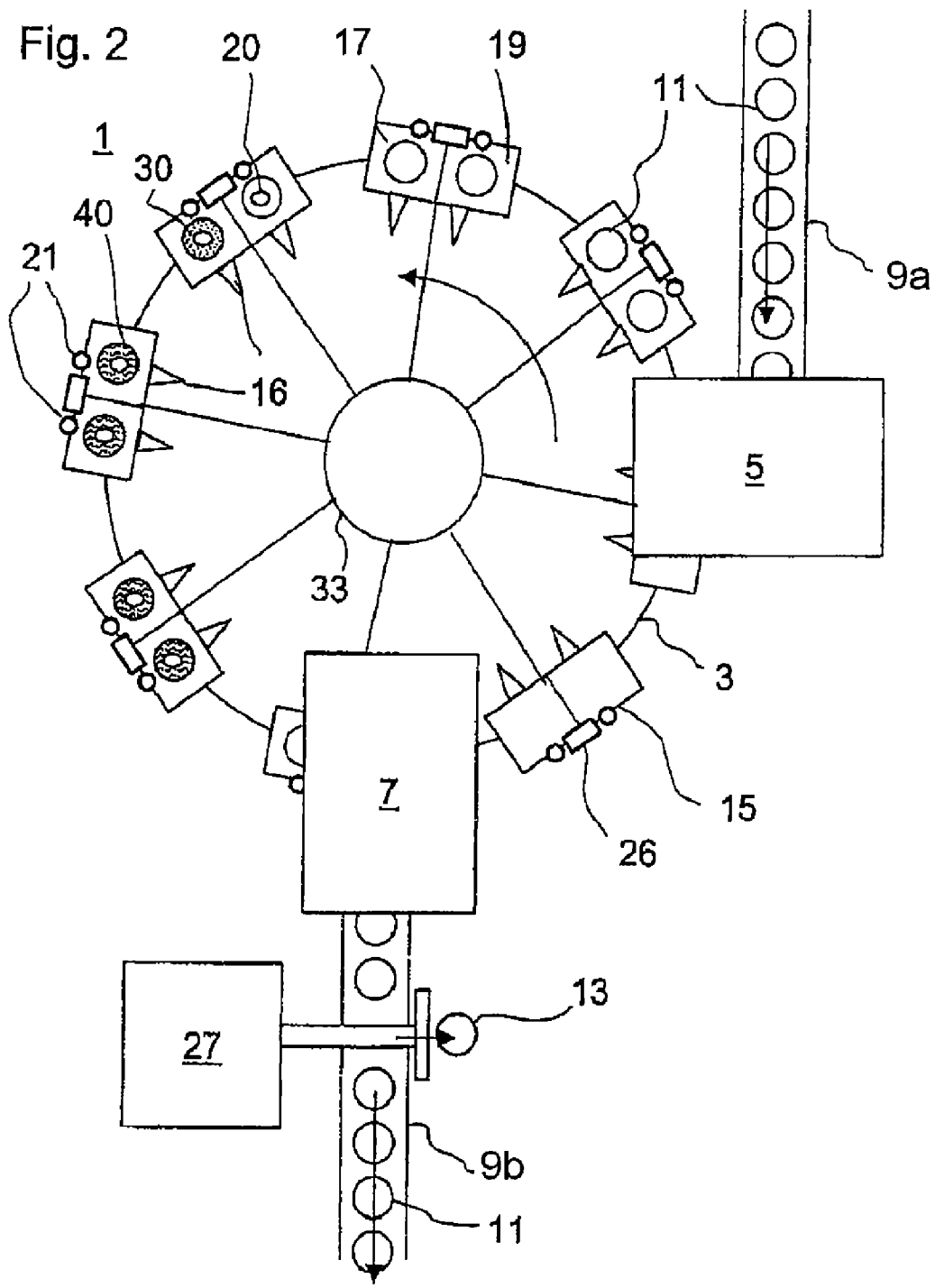

FIG. 1 shows am exemplary embodiment of an apparatus According to the invention, FIG. 2 shows a variant of the exemplary embodiment illustrated in FIG. 1, FIG. 3 to 5 show the time profile of the SiO emission line at 425 nm during a microwave pulse for three different Bottle shapes, and FIG. 6 to FIG. 9 show various embodiments of measuring Devices for measuring spectral parameters.

DETAILED DESCRIPTION OF THE INVENTION

FIG. 1 diagrammatically depicts an exemplary embodiment of an apparatus according to the invention, which is denoted overall by reference numeral 1, for coating workpieces by means of plasma-induced chemical vapor deposition. The apparatus 1 comprises a conveyor device 3, which is designed as a rotary conveyor, and on which reactors 15 each having two coating chambers 17, 19 are arranged and transported along a circular conveying path by means of the conveyor device 3. Furthermore, there is a loading device 5 and a removal device 7, by means of which the workpieces are introduced into the reactors 15 and removed from them.

The apparatus 1 of the exemplary embodiment shown in FIG. 1 is designed for the internal coating of containers, such as in particular bottles 11. The bottles 11 are conveyed by means of a loading conveyor device 9a to the loading device 5 and from the loading device 5 are inserted into the coating chambers 17, 19 of the reactors 15. During rotation of the reactors 15 on the rotary conveyor 3, the coating chambers 17, 19 and the interior of the container are evacuated. In the process, the area surrounding the bottle is evacuated down to from 10 mbar to 50 mbar and the interior of the bottle is evacuated down to a lower pressure of below 2 mbar. A pumping device 33, which is connected to the coating chambers 17, 19, is provided for evacuation. In the exemplary embodiment shown in FIG. 1, the pumping device 33 is arranged on the rotary conveyor 3 and therefore likewise rotates.

As part of a device for introducing process gas, lances 20 are moved into the bottles 11 and process gas 30 is admitted.

Microwave heads 16 of the reactors 15 introduce electromagnetic energy in the form of pulsed electromagnetic waves, for example with a frequency of 2.45 GHz, into the coating chambers 17, 19, with the result that a plasma 40 is generated in the process gas atmosphere in the interior of the bottles. Moreover, there is a measuring device 21 which records a spectral parameter of the emission spectrum. The measured parameter(s) are processed by a monitoring device, for example, as shown in FIG. 1, a computer 25, and compared with desired values. If the spectral parameter is within a predetermined desired range, the coating process and the workpiece are determined to be in order. As an alternative or in addition, as well as measuring the intensity of emission lines of the plasma, it is also possible to record absorption lines of the absorption spectrum, for example in order to monitor the composition of the process gas in the interpulse periods.

In addition, it is also possible, as shown in FIG. 1, for measuring devices 21 connected to the computer 25 to be arranged in the feedlines to the pumping device 33, in order to record a spectral parameter of the emission and/or absorption spectrum of the process waste gas. It is in this way also possible to analyze the process waste gas.

After the bottles have been coated, the coating chambers 17, 19 of the reactors are vented and the bottles 11, i.e. coated workpieces 11, are removed by means of the removal device 7 and placed on a further removal conveyor device 9b.

If the measured spectral parameter deviates from the predetermined desired range, the bottle in question and/or its coating is recognized as being defective and a defective bottle 13 is removed. For this purpose, there is a device 27 for removing defective bottles 13 which, for example, removes the respective bottles 13 from the removal conveyor device 9b. The device 27 is connected to the computer 25 and is driven accordingly by the computer 25, in the event of the measured spectral parameter deviating from the predetermined desired range, in order for the defective bottle 13 subsequently to be removed from the quantity of the other bottles 11 on the removal conveyor device 9b.

The measuring device 21 can particularly preferably be designed to measure a nitrogen emission line. By way of example, the measuring device 21 may for this purpose comprise a photodiode with an optical filter for measuring the N* line at 745 nm. If an N* line of sufficient intensity and therefore the presence of nitrogen in the process gas is then measured in the emission spectrum by means of the photodiode, this indicates a leak in the bottle 11, since the nitrogen partial pressure in the area surrounding the bottle is higher than in the interior of the bottle, and nitrogen from the residual gas atmosphere is penetrating from the coating chamber into the interior of the bottle. It is in this way likewise possible to detect a leak in the gas feedline for the process gas. If the concentration is sufficient, the penetration of nitrogen can even be detected easily by the naked eye, since the plasma then adopts an orange-red color.

If, for example, a bottle is being coated using a process gas flow rate of 1 000 sccm of precursor gas, and the bottle has a hole of a diameter of 1 mm and the pressure outside the bottle is 10 mbar, in the event of a blocked flow, as occurs with a diaphragm, the result is a leakage flow of:

$$\text{Leakage flow [mbar*l/s]} = 15.7 \ [\text{l/s*1/cm}^2] \ * \text{diameter}^2 * \text{pressure [mbar]}$$

Under the abovementioned conditions, this equates to 1.6 mbar*l/sec (94 sccm). A pressure measurement would have to be accurate to within 10% in order to allow a leak of this type to be detected. However, this is technically demanding. A spectral measurement merely has to distinguish between the presence or absence of a nitrogen emission line and can recognize a bottle with a leak of this type without problems and in a simple way, so that the bottle can be reliably removed.

Further lines with an intensity suitable for monitoring the coating operation include, inter alia, the O* emission lines at 367 nm and 777 nm, and the SiO line at 425 nm.

FIG. 2 shows a variant of the exemplary embodiment shown in FIG. 1. In this variant, measuring devices 21 are arranged at each coating chamber 17, 19 of the reactors 15. The monitoring device which is used to compare the parameter with a desired range in this example comprises microcontrollers 26 at each of the reactors 15. If a comparison of a measured spectral parameter, such as for example the intensity of the N* emission line, indicates a faulty coating process or a leak in the bottle, the microcontroller transmits a fault signal to the device 27, which then removes the defective bottle 13.

Figure 3:
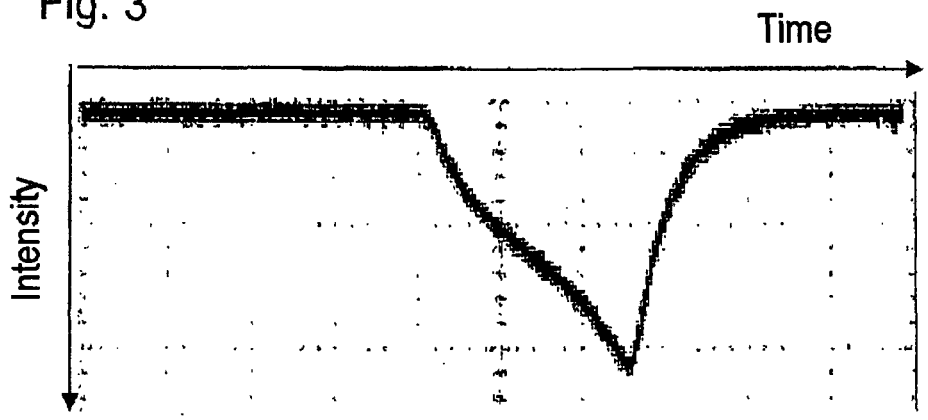
Figure 4:
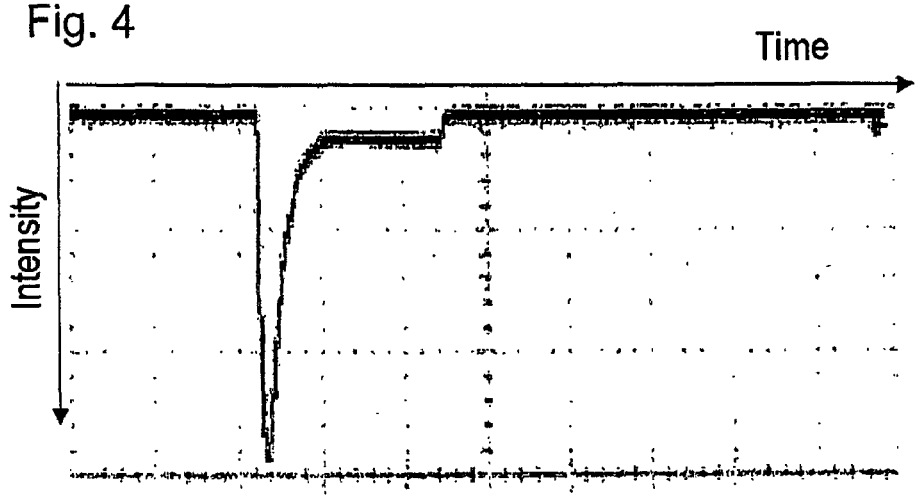
Figure 5:
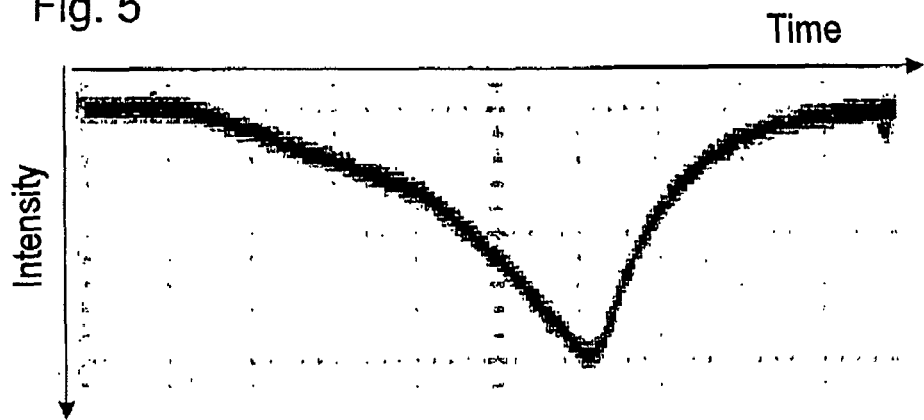

FIG. 3 to FIG. 5 show the measured time profile of the light emission of the SiO emission line at 425 nm from the plasma of the process gas during a pulse. This line occurs when silicon oxide barrier layers, for example with HMDSO and/or HMDSN as a process gas constituent, are being deposited by plasma coating.

The significantly different line shapes of the pulses are characteristic of the respective coating parameters. For example, conclusions can be drawn as to the process gas composition from the line shapes shown in FIGS. 3 to 5. Accordingly, the shape of the pulses can also be used to ascertain whether the coating process was defective, if the measured pulse shape deviates excessively from a desired curve, in order for defective workpieces to be removed.

All the abovementioned spectral parameters can advantageously also be used to control further parameters of the coating process, such as for example the process gas pressure, the pulse power or the duty cycle, i.e. the ratio of pulse duration to interpulse period, using a monitoring device, such as the computer 25 shown in FIG. 1.

Other possible spectral parameters are the number of plasma pulses determined on the basis of the intensity of the SiO emission line and the number of plasma pulses per unit time. The measured number of actual plasma pulses can advantageously be used to control the duration of the coating process. For example, it is in particular possible to continue coating until a predetermined number of pulses has been counted on the basis of the intensity of an emission line. It is in this way possible to achieve very uniform layer thicknesses within a batch of coated workpieces with a high level of reproducibility.

The measurement of the number of plasma pulses per unit time and/or the frequency thereof can in turn also be used to detect defective coatings and to remove defectively coated bottles, for example if the number of plasma pulses per unit time drops below a predetermined threshold value. For this purpose, the monitoring device, such as for example the computer 25 or the microcontrollers 26, can be designed to determine the number of plasma pulses per unit time. As an alternative or in addition, the monitoring device can also be designed to compare the number of plasma pulses with the number of electromagnetic pulses, and in the event of an excessive deviation to generate a fault signal, after which the defective bottle 13 is removed from production by means of the device 27 in response to the fault signal.

FIG. 6 to FIG. 9 diagrammatically depict various possible measuring devices for measuring spectral parameters.

Figure 6:
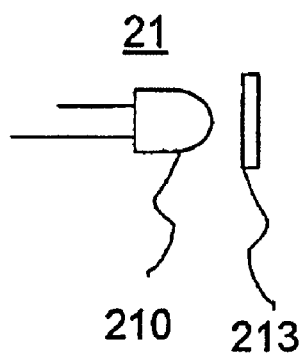

FIG. 6 shows a measuring device 21 which comprises a photodiode 210 with upstream interference filter 213. The interference filter can be designed, for example, for the transmission of the N* emission line at 745 nanometers, so that the measuring device 21 can be used to determine the nitrogen content of the plasma and therefore—in particular when using a process gas without nitrogen-containing components—the presence of leaks.

Figure 7:
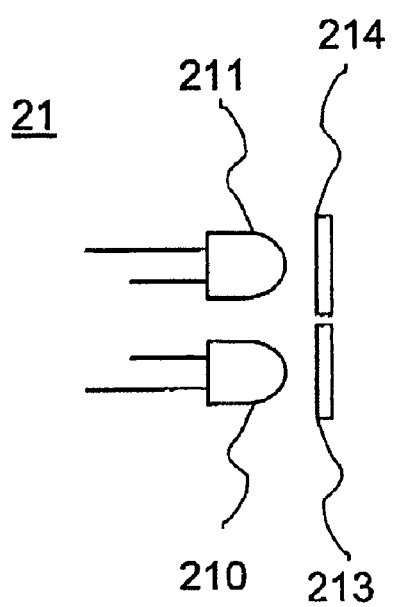

FIG. 7 shows a refinement of this measuring device with two photodiodes 210, 211, with different interference filters 213, 214 connected upstream of them. The filters 213, 214 may, for example, be adapted to two different emission lines. In particular, however, it is also possible for the filter 213 to be adapted to one emission line, for example once again the N* line at 745 nm, and for the other filter 214 to be adapted to a range next to this line, so that the photodiode 211 can be used to measure the background level. If the background signal is subtracted from the signal measured using the diode 210, the intensity of the emission line can be measured with a high degree of accuracy. This makes it possible, inter alia, to detect leaks even when using a nitrogen-containing process gas.

Figure 8:
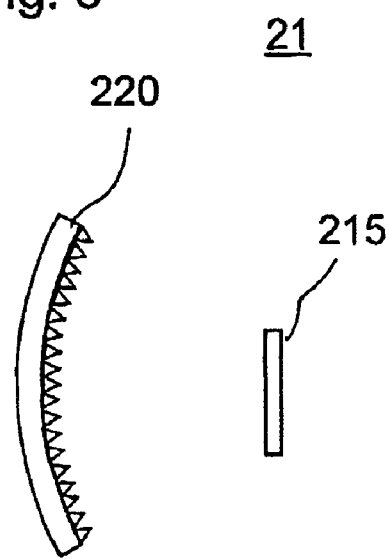
Figure 9:
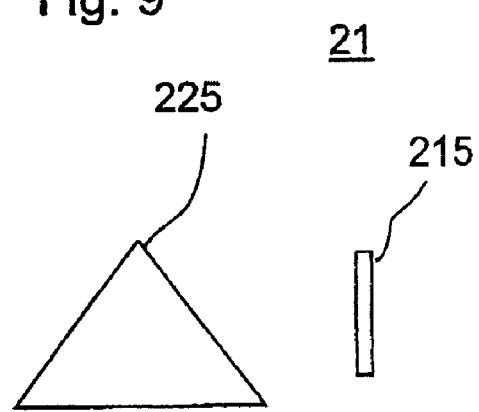

FIG. 8 diagrammatically depicts an embodiment of a measuring device 21 which can be used to measure entire emission spectra or partial regions of spectra. For this purpose, the measuring device 21 comprises a CCD chip 215 and an optical grating 220 which images the emission lines on the CCD module. As an alternative, as shown in FIG. 9, it is also possible to use a prism 225 instead of an optical grating 220.

It will be clear to the person skilled in the art that the invention is not restricted to the embodiments described above, but rather can be varied in numerous ways. In particular, the features of the individual exemplary embodiments can also be combined with one another.

The invention claimed is:

1. An apparatus for coating a container by plasma-induced chemical vapor deposition, comprising:
    a coating chamber having the container therein;
    a device for introducing a process gas without nitrogen-containing components into an interior of the container;
    a device for introducing electromagnetic energy into the coating chamber;
    a pumping device for evacuating an interior of the container so that nitrogen partial pressures of a residual gas in the interior of the container is lower than an exterior of the container;
    a measuring device for measuring at least one spectral parameter of a plasma generated in the process gas within the interior of the container by the electromagnetic energy, the measuring device being configured to measure an intensity of an emission line or an absorption line of nitrogen;
    a monitoring device to compare the at least one spectral parameter with a desired range, the monitoring device being configured to determine whether the container has a leak from the coating chamber into the interior of the container on the basis of a measurement of the at least one spectral parameter pertaining to nitrogen gas,
    the monitoring device being further configured to control a parameter of the coating process within the container by counting plasma pulses on a basis of an intensity of an emission line of the plasma of the process gas used for coating; and
    a device for removing the container if the at least one spectral parameter deviates from the desired range.

2. The apparatus as claimed in claim 1, wherein the apparatus is usable to internally coat the container.

3. The apparatus as claimed in claim 1, wherein the device for introducing electromagnetic energy comprises a device for supplying pulsed electromagnetic energy.

4. The apparatus as claimed in claim 3, wherein the measuring device measures a time profile of a light emission of the emission line of a constituent of the nitrogen.

5. The apparatus as claimed in claim 3, wherein the measuring device measures a time profile of an SiO emission line.

6. The apparatus as claimed in claim 1, wherein the monitoring device determines a number of plasma pulses per unit time.

7. The apparatus as claimed in claim 1, wherein the monitoring device compares a number of plasma pulses with a number of electromagnetic pulses.

8. The apparatus as claimed in claim 1, wherein the measuring device measures the intensity of the absorption line.

9. The apparatus as claimed in claim 1, wherein the measuring device measures at least one spectral parameter of an absorption spectrum or an emission spectrum of a process waste gas.

10. The apparatus as claimed in claim 1, further comprising a control device for controlling at least one further parameter using the at least one measured spectral parameter.

11. The apparatus as claimed in claim 10, wherein the at least one measured spectral parameter or the at least one further parameter is selected from the group consisting of a composition of the process gas, a pressure of the process gas, a power of the electromagnetic energy, a pulse duration of the electromagnetic energy, and a duty cycle of the electromagnetic energy.

12. An apparatus for coating a container by plasma-induced chemical vapor deposition, comprising:
a coating chamber having the container therein;
a pumping device for evacuating an interior of the container and the coating chamber so that nitrogen partial pressures of a residual gas in the interior of the container is lower than an exterior of the container within the coating chamber;
a device for introducing a non-nitrogen containing process gas into the interior of the container;
a device for introducing electromagnetic energy into the coating chamber to generate a plasma in the process gas within the container;
a measuring device for measuring at least one spectral parameter of the plasma; and a monitoring device to compare the at least one spectral parameter with a desired range, the monitoring device being configured to determine whether the container has a leak from the coating chamber into the interior of the container on the basis of a measurement of the at least one spectral parameter pertaining to nitrogen gas,
the monitoring device being further configured to control a parameter of the coating process within the container by counting plasma pulses on a basis of an intensity of an emission line of the plasma of the process gas used for coating.

13. An apparatus for coating a container by plasma-induced chemical vapor deposition, comprising:
a coating chamber having the container therein;
a pumping device connected to the coating chamber via an evacuation feedline, the pumping device evacuating an interior of the container and an interior of the coating chamber so that nitrogen partial pressures of a residual gas in the interior of the container is lower than the interior of the coating chamber;
a device for introducing a non-nitrogen containing process gas into the interior of the container;
a device for introducing electromagnetic energy into the coating chamber to generate a plasma in the process gas within the interior of the container;
a measuring device for measuring at least one spectral parameter of the plasma,
a monitoring device compares at least one spectral parameter of the plasma with a desired range, the monitoring device configured to determine whether the container has a leak from the interior of the coating chamber into the interior of the container on the basis of a measurement of the at least one spectral parameter of nitrogen gas;
the monitoring device being further configured to control a parameter of the coating process within the container by counting plasma pulses on a basis of an intensity of an emission line of the plasma of the process gas used for coating; wherein the apparatus further comprises:
a measuring device arranged in the evacuation feedline for measuring at least one spectral parameter of a process waste gas; and
the monitoring device to compare the at least one spectral parameter of the process waste gas with a desired range.

* * * * *